US012628463B2

(12) United States Patent
Siddique et al.

(10) Patent No.: US 12,628,463 B2
(45) Date of Patent: May 12, 2026

(54) METHODS AND SYSTEM OF ENHANCED NEAR-INFRARED LIGHT ABSORPTION OF IMAGING SYSTEMS USING METASURFACES AND NANOSTRUCTURES

(71) Applicant: Samsung Electronics Co., Ltd., Suwon-si (KR)

(72) Inventors: Radwanul Hasan Siddique, Monrovia, CA (US); Yibing Michelle Wang, Temple City, CA (US); Mahdad Mansouree, Amherst, MA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 828 days.

(21) Appl. No.: 17/703,961

(22) Filed: Mar. 24, 2022

(65) Prior Publication Data

US 2022/0359772 A1     Nov. 10, 2022

Related U.S. Application Data

(60) Provisional application No. 63/299,912, filed on Jan. 14, 2022, provisional application No. 63/186,775, filed on May 10, 2021.

(51) Int. Cl.
| | | |
|---|---|---|
| *H10F 77/70* | (2025.01) | |
| *H04N 23/21* | (2023.01) | |
| *H10F 39/00* | (2025.01) | |

(52) U.S. Cl.
CPC ........... *H10F 77/707* (2025.01); *H04N 23/21* (2023.01); *H10F 39/805* (2025.01); *H10F 39/807* (2025.01)

(58) Field of Classification Search
CPC ......... H01L 27/14627; H01L 27/14605; H01L 27/14625; G01J 1/0422
See application file for complete search history.

(56) References Cited

U.S. PATENT DOCUMENTS

| | | | |
|---|---|---|---|
| 10,163,974 B2 | 12/2018 | Su et al. | |
| 10,510,799 B2 | 12/2019 | Su et al. | |

(Continued)

FOREIGN PATENT DOCUMENTS

| | | |
|---|---|---|
| EP | 3411906 A1 | 12/2018 |
| WO | 2020007622 A1 | 1/2020 |
| WO | 2021161543 A1 | 8/2021 |

OTHER PUBLICATIONS

European Extended Search Report for Application No. 22172310.9, mailed Sep. 19, 2022.

(Continued)

*Primary Examiner* — Kretelia Graham
*Assistant Examiner* — David J Goodwin
(74) *Attorney, Agent, or Firm* — Renaissance IP Law Group LLP

(57) ABSTRACT

A pixel for an imaging sensor is disclosed that includes a photodetector and a metasurface. The photodetector includes a first surface and sidewalls that extend into the photodetector in a first direction from the first surface. The metasurface is formed on the first surface and includes nanostructures that bend a predetermined range of wavelengths of light at least 70 degrees in opposing angles from a direction that is substantially perpendicular to the first surface, and a standing wave pattern forms in an active region of the pixel. The predetermined range of wavelengths of light includes 700 nm to 1100 nm inclusive. In one embodiment, the pixel is a silicon-based photodetector, a thickness of the pixel in the first direction is less than or equal to 5 µm, and the pixel absorbs at least 20% of a power of the predetermined range of wavelengths of light.

20 Claims, 6 Drawing Sheets

(56) References Cited

U.S. PATENT DOCUMENTS

| | | | |
|---|---|---|---|
| 10,770,505 B2 | 9/2020 | Hicks et al. | |
| 11,114,488 B1 | 9/2021 | Lu et al. | |
| 2015/0221693 A1* | 8/2015 | Saitou | H10F 39/8067 |
| | | | 257/432 |
| 2017/0161557 A9 | 6/2017 | Saylor et al. | |
| 2018/0102442 A1* | 4/2018 | Wang | H01L 31/02327 |
| 2019/0033683 A1 | 1/2019 | Ahmed et al. | |
| 2019/0044003 A1 | 2/2019 | Heck et al. | |
| 2019/0064532 A1 | 2/2019 | Riley, Jr. et al. | |
| 2019/0383943 A1 | 12/2019 | Dunn et al. | |
| 2020/0098814 A1 | 3/2020 | Yang | |
| 2020/0135776 A1* | 4/2020 | Finkelstein | H01L 31/0232 |
| 2020/0194474 A1* | 6/2020 | Meynants | H01L 27/1462 |
| 2021/0111211 A1* | 4/2021 | Dilhan | H01L 27/14627 |
| 2021/0126029 A1 | 4/2021 | Roh et al. | |
| 2021/0149081 A1* | 5/2021 | Groever | G02B 5/1842 |
| 2021/0223104 A1 | 7/2021 | Siddique et al. | |
| 2021/0223444 A1 | 7/2021 | Siddique et al. | |
| 2021/0273120 A1 | 9/2021 | Zang et al. | |

OTHER PUBLICATIONS

Li, Bo et al., "Metalens-Based Miniaturized Optical Systems" Micromachines 2019, vol. 10, No. 5, 2019, 21 pages.
Liu, Zihao et al., "Asymmetric all Silicon Micro-Antenna Array for High Angle Beam Bending in Terahertz Band", IEEE Photonics Journal, vol. 11, No. 2, 2019, 10 pages.

* cited by examiner

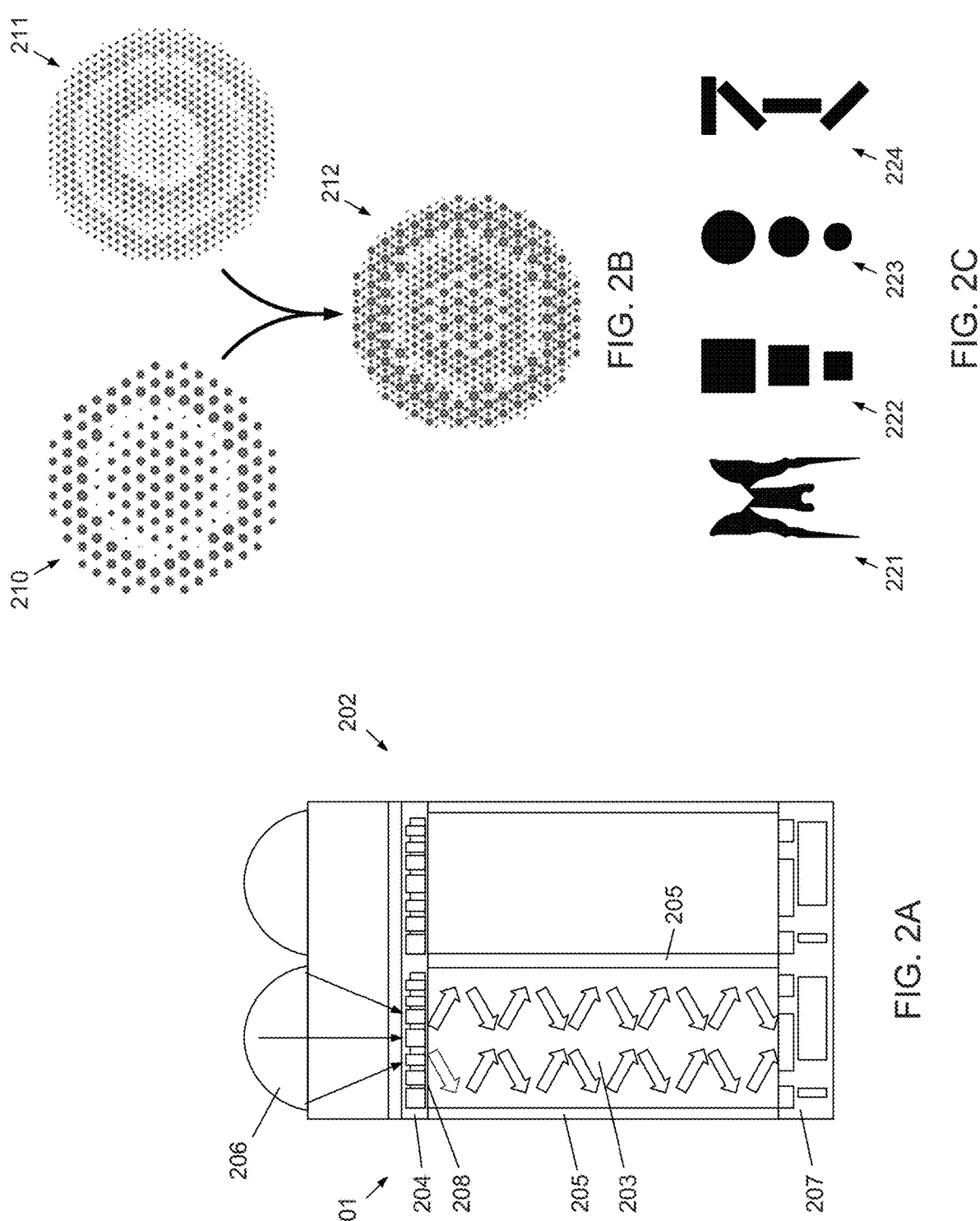

601 Design metasurface based on a desired bending of incident NIR light

602 Deposit thin-film material on surface of CIS pixel

603 Pattern photoresist layer on thin-film material

604 Etch pattern

605 Transfer etched pattern onto the nanostructure material.

606 Repeat for additional metasurface layers

607 Form anti-reflective coating

600

METHODS AND SYSTEM OF ENHANCED NEAR-INFRARED LIGHT ABSORPTION OF IMAGING SYSTEMS USING METASURFACES AND NANOSTRUCTURES

CROSS-REFERENCE TO RELATED APPLICATION

This application claims the priority benefit under 35 U.S.C. § 119(e) of U.S. Provisional Application No. 63/186,775, filed on May 10, 2021, and U.S. Provisional Patent Application No. 63/299,912, filed on Jan. 14, 2022, the disclosures of which are incorporated herein by reference in their entirety.

TECHNICAL FIELD

The subject matter disclosed herein relates to metasurfaces and nanostructured surfaces. More particularly, the subject matter disclosed here relates to a metasurface that bends Near-infrared (NIR) radiation at a target wavelength in high-degree opposing angles to maximize absorption of the NIR radiation in a CMOS image sensor (CIS).

BACKGROUND

NIR sensing technology has been extensively applied in Time-of-Flight (ToF), surveillance, machine vision, augmented reality (AR), virtual reality (VR), biological inspection, and optical communications. Silicon-based CISs, however, have insufficient sensitivity and low QE because silicon has a low NIR wavelength absorption, especially for wavelengths greater than 900 nm. At NIR wavelengths, absorption by silicon is low and most of the incident power (~80%) passes through the active region of a CIS.

FIGS. 1A and 1B are graphs that respectively show absorption coefficient and absorption depth of silicon. In the graph of FIG. 1A, the absorption coefficient for a range of NIR wavelengths is about $1 \times 10^{-3}$ per cm at 700 nm to about $1 \times 10^{-2}$ per cm at 1200 nm. In the graph of FIG. 1B, the absorption depth for the same range of NIR wavelengths is about $1 \times 10^{-3}$ cm at 700 nm to between about $1 \times 10^{-2}$ cm and $1 \times 10^{-1}$ cm at 1200 nm. Thus, the absorption depth for this range of NIR wavelengths is well beyond the depth of most CMOS image sensors, which is typically between 100 nm to 1000 nm.

SUMMARY

An example embodiment provides a pixel for an imaging sensor that may include a photodetector having a first surface and sidewalls that extend into the photodetector in a first direction from the first surface, and a metasurface on the first surface in which the metasurface may include nanostructures that bend a predetermined range of wavelengths of light at least 70 degrees from a direction that is substantially perpendicular to the first surface. In one embodiment, the metasurface bends the predetermined range of wavelengths of light at least 70 degrees in opposing angles from the direction that is substantially perpendicular to the first surface. In another embodiment, the predetermined range of wavelengths of light may include 700 nm to 1100 nm inclusive. In still another embodiment, the pixel may have a thickness in the first direction of less than or equal to 5 μm. In still another embodiment, a standing wave pattern forms in an active region of the pixel. In one embodiment, the photodetector comprises a silicon-based photodetector, and the pixel absorbs at least 20% of a power of the predetermined range of wavelengths of light. In another embodiment, the photodetector may be an avalanche photodiode, a single photon avalanche diode, a quanta image sensor or a PIN diode. In still another embodiment, the sidewalls may be deep trench isolation (DTI) structures, and may be formed from a metal or a doped semiconductor material. In yet another embodiment, the pixel may further include an anti-reflective coating formed on the metasurface opposite the first surface. In one embodiment, the pixel may be part of an array of pixels.

An example embodiment provides a pixel for an imaging sensor that may include a photodetector having a first surface, a first sidewall and a second sidewall in which the first sidewall and the second sidewall extend into the photodetector in a first direction from the first surface on opposite sides of the photodetector, and a metasurface on the first surface in which the metasurface may include nanostructures that bend a predetermined range of wavelengths of light at least 70 degrees from a direction that is substantially perpendicular to the first surface toward the first sidewall and at least 70 degrees from the direction that is substantially perpendicular to the first surface toward the second sidewall. In one embodiment, the predetermined range of wavelengths of light may include 700 nm to 1100 nm inclusive. In another embodiment, the pixel may have a thickness in the first direction of less than or equal to 5 μm. In still another embodiment, a standing wave pattern forms in an active region of the pixel. In yet another embodiment, the photodetector may include a silicon-based photodetector, and the pixel absorbs at least 20% of a power of the predetermined range of wavelengths of light. In one embodiment, the photodetector may be an avalanche photodiode, a single photon avalanche diode, a quanta image sensor or a PIN diode. In another embodiment, the first sidewall and the second sidewall may be deep trench isolation (DTI) structures, and the first sidewall and the second sidewall may be a metal or a doped semiconductor material. In still another embodiment, the pixel may be part of an array of pixels.

BRIEF DESCRIPTION OF THE DRAWING

In the following section, the aspects of the subject matter disclosed herein will be described with reference to exemplary embodiments illustrated in the figure, in which:

FIG. 2A depicts a cross-sectional drawing of two adjacent example CIS pixels and according to the subject matter disclosed herein;

FIG. 2B depicts an example pattern of an example metasurface according to the subject matter disclosed herein;

FIG. 2C depicts several example plan-view shapes that nanostructures of a metasurface may be according to the subject matter disclosed herein;

DETAILED DESCRIPTION

Figure 1B:
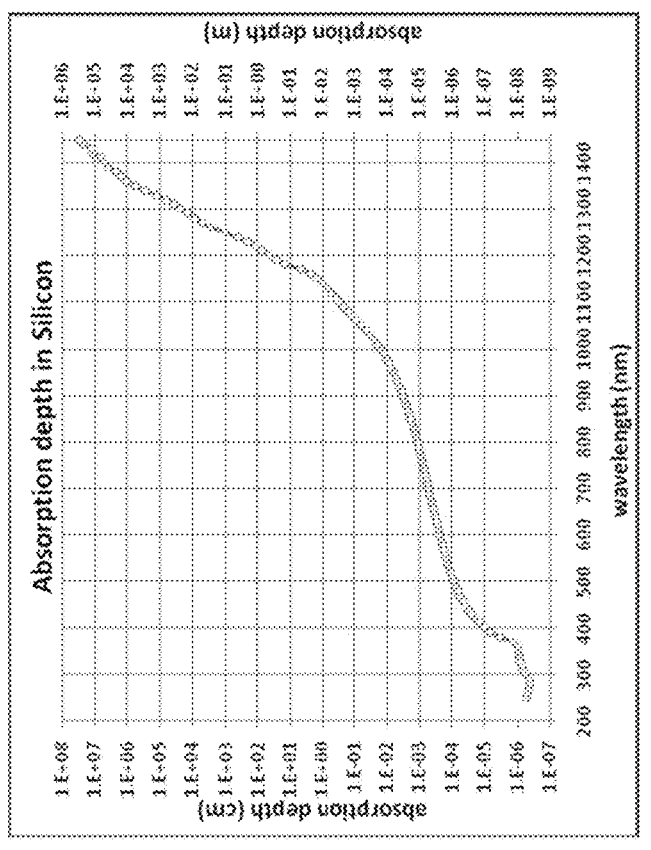
FIGS. 1A and 1B are graphs that respectively show absorption coefficient and absorption depth of silicon.
Figure 1A:
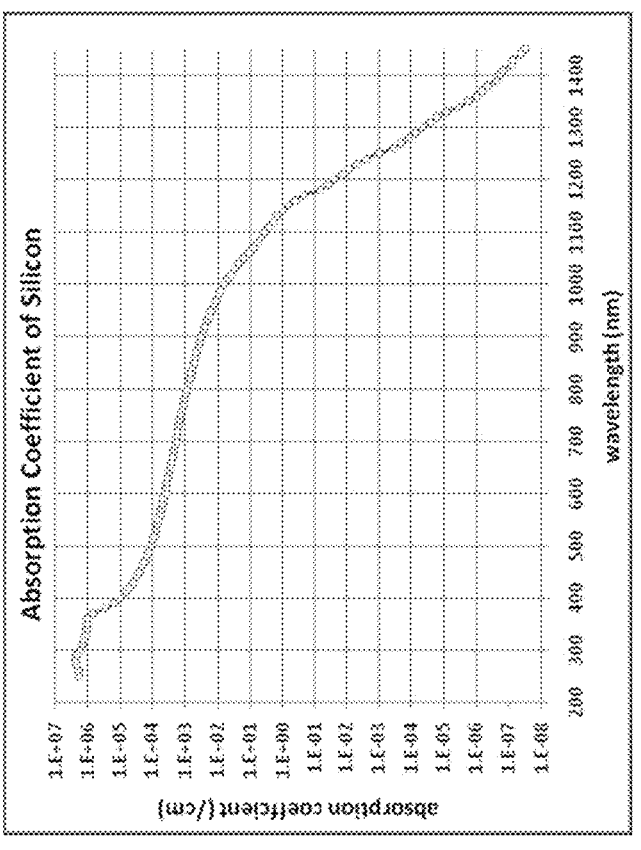

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

The subject matter disclosed herein provides a metasurface that bends NIR radiation at a target wavelength in high-degree opposing angles to maximize absorption of the NIR radiation in a CIS. Full-well Deep Trench Isolation (DTI) that are reflecting sidewalls create spatially localized resonances, or standing waves, of the target wavelength that lengthens the path of the NIR radiation in a CIS to maximize absorption. CMOS processing of $Si/SiO_x/Si_xN_y/Si_xO_yN_z/$ airgap (holes etched or pillars extended into pixel) may be used having a CIS structure size of between about 10-500 nm and a height of about 50-5000 nm, in which a shape of the CIS structure may be circular, rectangular, hexagonal, ellipsoidal or an arbitrary shape. The same idea may also be extended to non-Si based photo detection systems.

The subject matter disclosed herein provides a metasurface-based solution to improve the QE of different photo-detectors PDs for NIR. For example, the metasurfaces and nanostructures disclosed herein may be used with Si-based photodetectors, such as a Single Photon Avalanche Diode (SPAD), an Avalanche Photodiode (APD), and a Quanta Image Sensor (QIS).

In one embodiment, the subject matter disclosed herein provides is a high Quantum Efficiency (QE) CIS that may be used for low-light applications. In other embodiments, the metasurfaces disclosed herein may be integrated with IR pixels and/or RGB-IR pixels.

Additionally, the metasurfaces disclosed herein may be used to increase the NIR QE of a CIS to provide NIR sensing systems having a lower emitting power and a correspondingly longer operating range. Further, the metasurfaces disclosed herein may be used to boost the QE of a CIS sensor to be greater than 50% and thereby provide a performance that is comparable to that of RGB sensors.

One example embodiment provides an imaging sensor system that may include a pixel array having a plurality of pixel cells disposed in a semiconductor layer (active area). At least one of the pixel cells may include an anti-reflective coating that may be based on metal and/or semiconductor oxides and nitrides to reduce reflection losses. Divergent optics may bend incoming light in opposing high angles (above 70° and up to 89.5°) within an active area the pixel to create optical resonances and/or standing waves of the incoming light wavelength. The divergent optics may be embedded on top of the pixel active area or etched in to the active area. The divergent optics may be a single layer or may be multiple layers of metasurfaces or microlenses or combination of microlenses and metasurfaces. In one embodiment, the divergent optics may contain either a divergent microlens or combination of convergent and divergent microlenses. In one embodiment, the metasurface may include subwavelength nanostructures. In another embodiment, an aspect ratio (height/size) of the nanostructures may extend from 1 to 500. Additionally, the divergent optics may have a high numerical aperture diverging phase profile. The at least one pixel may also include full-well DTI on the sidewalls to reflect the light within the pixel. The photon detector of the at least one pixel may be a SPAD, an APD, a QIS or a PIN diode.

FIG. 2A depicts a cross-sectional drawing of two adjacent example CIS pixels 201 and 202 according to the subject matter disclosed herein. Each CIS pixel includes a photodiode 203, a metasurface 204, DTI sidewalls 205, a microlens 206 and electronic circuitry 207, which are only indicated for CIS pixel 201. The metasurface 204 is formed on a surface 208 of a CIS pixel. The microlens 206 may be formed on the metasurface 204. Alternatively, the microlens 206 may be formed so that it is not in contact with the metasurface 204. In one embodiment, the CIS pixels 201 and 202 may be part of an array of CIS pixels. The DTI sidewalls 205 are reflective to NIR radiation. In one embodiment, the DTI sidewalls 205 may be formed from metal. In another embodiment, the DTI sidewalls 205 may be formed from highly-doped silicon (either n or p doping). In one embodiment, one or more anti-reflective surfaces 209 may be formed between the metasurface 205 and the microlens 206.

FIG. 2B depicts an example pattern of an example metasurface 204 according to the subject matter disclosed herein. The metasurface 204 includes right-side scattering nanostructures, which are indicated by pattern 210, and left-side scattering nanostructures, which are indicated by pattern 211. Pattern 210 and pattern 211 may be used to form a spatial-multiplexed pattern 212 for the metasurface 204, which the combination of pattern 210 and pattern 211.

A metasurface phase profile may be designed and optimized to bend the angle of light to enhance the absorption inside a CIS pixel. Metasurface nanostructures may have optimized random shapes for large bending angle of light with high efficiencies. FIG. 2C depicts several example plan-view shapes that nanostructures of a metasurface may be according to the subject matter disclosed herein. For example, one or more of the nanostructures of a metasurface may be an arbitrary plan-view shape 221, a square plan-view shape 222, a circular (or oval) plan-view shape 223, and/or a rectangular plan-view shape 224. Other shapes are also possible.

Figure 3B:
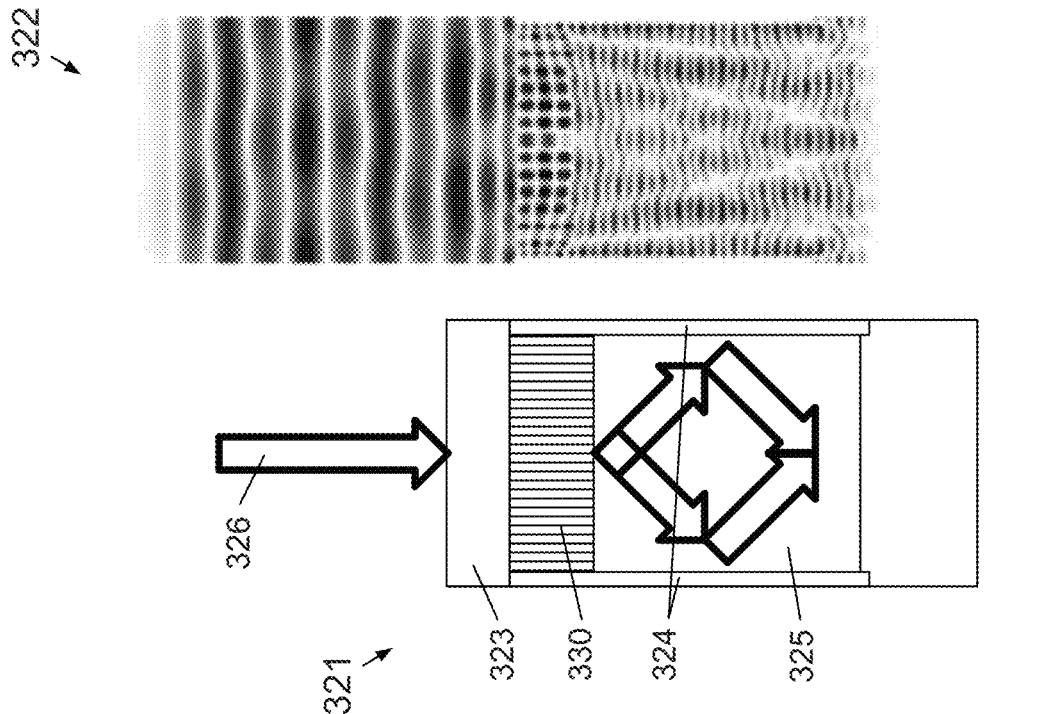
FIGS. 3A and 3B respectively depict cross-sectional views of a traditional CIS structure and corresponding electric field pattern in contrast to a CIS structure and corresponding electric field pattern for a CIS having a metasurface according to the subject matter disclosed herein.
Figure 3A:
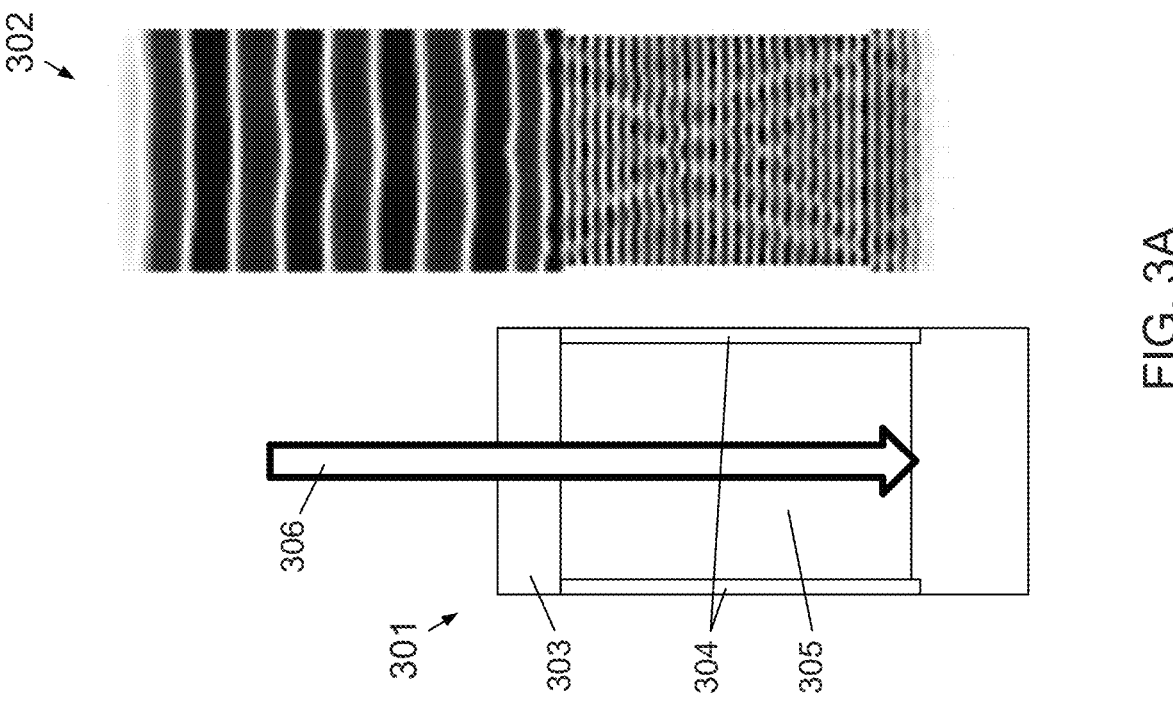

FIGS. 3A and 3B respectively depict cross-sectional views of a traditional CIS structure 301 and corresponding electric field pattern 302 in contrast to a CIS structure 321 and corresponding electric field pattern 322 for a CIS having a metasurface according to the subject matter disclosed herein. In FIG. 3A, the traditional CIS structure 301 may include one or more antireflective coating silica layers 303 DTI sidewalls 304, and an active region 305, which may be formed from crystalline silicon. The one or more silica layers 303 may be formed from $SiO_x/Si_xN_y/Si_xO_yN_z$. NIR radiation 306 is shown being incident upon the layer 303 and passing into the active region 305. The corresponding electric field pattern 302 for the incident NIR radiation 306 is depicted next to the traditional CIS structure 301. Generally, the NIR radiation 306 passes through the active region 305 and absorption of the NIR radiation 306 is relatively low.

In FIG. 3B, the CIS structure 321 may include one or more antireflective coating silica layers 323, DTI sidewalls 324, and an active region 325, which may be formed from crystalline silicon. The one or more silica layers 323 may be formed from $SiO_x/Si_xN_y/Si_xO_yN_z$. Additionally, the CIS structure 321 includes a metasurface 330 that bends NIR radiation of a target wavelength in high-degree opposing angles to maximize absorption of the NIR radiation the active region 325 by lengthening the path of the NIR radiation. NIR radiation 326 is shown being incident upon the layer 323 and passes through the metasurface 330 where the NIR radiation is bend in high-degree opposing angles in the active region 325. The corresponding electric field pattern 322 for the incident NIR radiation 326 is depicted next to the CIS structure 321. A standing wave pattern for the NIR radiation 326 is depicted adjacent to the active region 325.

Figure 4:
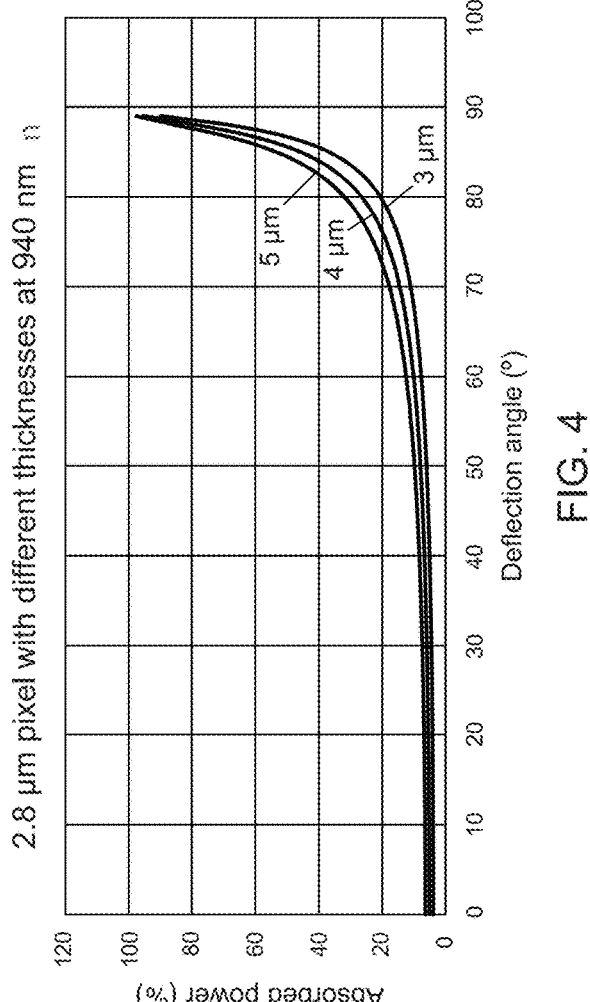
FIG. 4 is a graph showing simulated results of percentage power absorption as a function of metasurface deflection angle for three CIS pixels having different (full well) active regions at 940 nm according to the subject matter disclosed herein.

FIG. 4 is a graph showing simulated results of percentage power absorption as a function of metasurface deflection angle for three CIS pixels having different (full well) active regions at 940 nm according to the subject matter disclosed herein. As used herein, the term "metasurface deflection angle" refers to the path angle of that a given, or a target, light wavelength deflects from a direction that is normal, or perpendicular, to a surface of, for example, a CIS pixel. For FIG. 4, the target light wavelength is 940 nm, and the surface width of the CIS pixel is 2.8 μm. As can been seen from FIG. 4, when the metasurface deflection angle exceeds 70°, the absorbed power begins to dramatically increase. As the depth of a pixel increases, the deflected path of a target light wavelength within the active region of the pixel increases, thereby increasing the percentage power absorption. For example, for an 80% efficiency of an 80° bending angle at 940 nm wavelength, a 3 μm pixel depth has about a 22.5% QE, a 5 μm pixel depth has about a 62% QE, and a 7 μm pixel depth has about a 74% QE. As the metasurface deflection angle increases beyond 80°, the percentage power absorption tends toward 100% for 940 nm.

Figure 5:
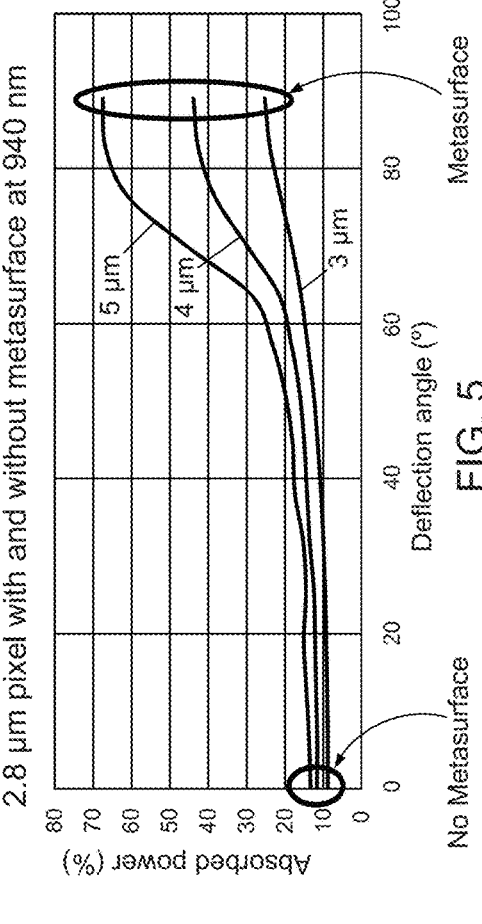
FIG. 5 is a graph showing simulated results of a contrast of percentage power absorption as a function of metasurface deflection angle for three CIS pixels having different (full well) active regions at 940 nm with and without a metasurface according to the subject matter disclosed herein.

FIG. 5 is a graph showing simulated results of a contrast of percentage power absorption as a function of metasurface deflection angle for three CIS pixels having different (full well) active regions at 940 nm with and without a metasurface according to the subject matter disclosed herein. No metasurface corresponds to a deflection angle of 0°. When a metasurface is used, the percentage power absorption increases as the metasurface deflection angle increases.

Figure 6:
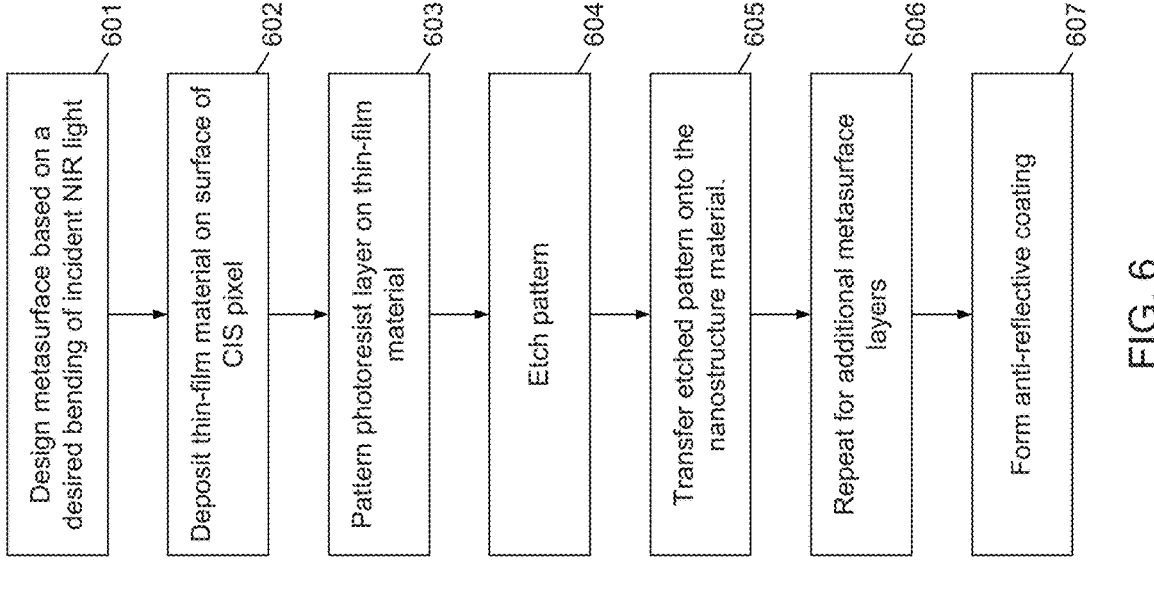
FIG. 6 is a flowchart for a method for fabricating a metasurface according to the subject matter disclosed herein.

FIG. 6 is a flowchart for a method 600 for fabricating a metasurface according to the subject matter disclosed herein. At 601, a metasurface pattern is designed based on a desired bending of incident NIR light through the metasurface. At 602, a thin-film material for the metasurface is deposited on a surface of a CIS pixel. The thin-film material may include SiO$_x$/Si$_x$N$_y$/Si$_x$O$_y$N$_z$/TiO$_x$/a-Si, p-Si, HfO$_x$, or any other high dielectric constant materials and optically transparent in the 700-1000 nm spectrum range. At 603, optical lithography may use, for example, deep or extreme UV to pattern a photoresist layer on the thin-film material to form a desired pattern of nanostructures on the CIS pixel. At 604, the pattern is etched using either a dry or a wet etch. At 605, etched areas may be transferred on to the thin-film material. At 606, depositing a thin-film material, forming of a photoresist layer and etching may be repeated for each metasurface layer. At 607, one or more anti-reflective layers may be formed on the final metasurface pattern.

Figure 7:
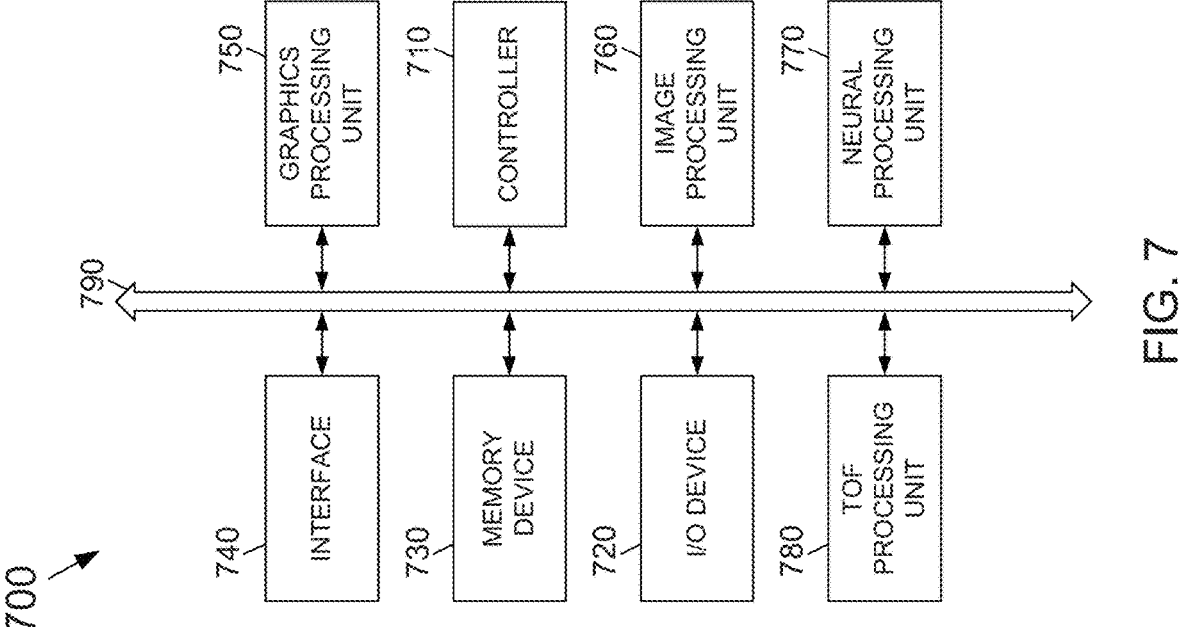
FIG. 7 depicts an electronic device that may include at least one CIS pixel that has a metasurface that bends NIR radiation at a target wavelength in high-degree opposing angles to maximize absorption of the NIR radiation in the CIS pixel according to the subject matter disclosed herein.

FIG. 7 depicts an electronic device 700 that may include at least one CIS pixel that has a metasurface that bends NIR radiation at a target wavelength in high-degree opposing angles to maximize absorption of the NIR radiation in the CIS pixel according to the subject matter disclosed herein. Electronic device 700 and the various system components of electronic device 700 may be formed from one or modules. The electronic device 700 may include a controller (or CPU) 710, an input/output device 720 such as, but not limited to, a keypad, a keyboard, a display, a touch-screen display, a 2D image sensor, a 3D image sensor, a memory 730, an interface 740, a GPU 750, an imaging-processing unit 760, a neural processing unit 770, a TOF processing unit 780 that are coupled to each other through a bus 790. In one embodiment, the 2D image sensor and/or the 3D image sensor may be part of the imaging processing unit 760. In another embodiment, the 3D image sensor may be part of the TOF processing unit 780. In one embodiment, the 2D image sensor and/or the 3D image sensor include at least one CIS pixel that has a metasurface that bends NIR radiation at a target wavelength in high-degree opposing angles to maximize absorption of the NIR radiation in the CIS pixel according to the subject matter disclosed herein. The controller 710 may include, for example, at least one microprocessor, at least one digital signal processor, at least one microcontroller, or the like. The memory 730 may be configured to store a command code to be used by the controller 710 and/or to store a user data.

The interface 740 may be configured to include a wireless interface that is configured to transmit data to or receive data from, for example, a wireless communication network using a RF signal. The wireless interface 740 may include, for example, an antenna. The electronic system 700 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), Fifth-Generation Wireless (5G), Sixth-Generation Wireless (6G), and so forth.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A pixel for an imaging sensor, comprising:
a photodetector comprising a first surface and sidewalls that extend into the photodetector in a first direction from the first surface; and
a metasurface on the first surface, the metasurface comprising nanostructures that bend Near Infrared (NIR) radiation in a predetermined range of wavelengths at an angle of at least 70 degrees from a direction that is substantially perpendicular to the first surface,
wherein the metasurface is within the sidewalls and receives the NIR radiation through a microlens on the metasurface, and
wherein the sidewalls are reflecting to create spatially localized resonances of a target wavelength that lengthens a path of the NIR radiation.

2. The pixel of claim 1, wherein the metasurface bends the predetermined range of wavelengths of light at least 70 degrees in opposing angles from the direction that is substantially perpendicular to the first surface.

3. The pixel of claim 1, wherein the predetermined range of wavelengths of light comprises 700 nm to 1100 nm inclusive.

4. The pixel of claim 1, wherein the pixel comprises a thickness in the first direction of less than or equal to 5 μm.

5. The pixel of claim 1, wherein a standing wave pattern forms in an active region of the pixel.

6. The pixel of claim 1, wherein the photodetector comprises a silicon-based photodetector, and
wherein the pixel absorbs at least 20% of a power of the predetermined range of wavelengths of light.

7. The pixel of claim 6, wherein the photodetector comprises an avalanche photodiode, a single photon avalanche diode, a quanta image sensor or a PIN diode.

8. The pixel of claim 1, wherein the sidewalls comprise deep trench isolation (DTI) structures.

9. The pixel of claim 8, wherein the sidewalls comprises a metal or a doped semiconductor material.

10. The pixel of claim 1, further comprising an anti-reflective coating formed on the metasurface opposite the first surface.

11. The pixel of claim 1, wherein the pixel is part of an array of pixels.

12. A pixel for an imaging sensor, comprising:
a photodetector comprising a first surface, a first sidewall and a second sidewall, the first sidewall and the second sidewall extending into the photodetector in a first direction from the first surface on opposite sides of the photodetector; and
a metasurface on the first surface, the metasurface comprising nanostructures that bend Near Infrared (NIR) radiation in a predetermined range of wavelengths at an angle of at least 70 degrees from a direction that is substantially perpendicular to the first surface toward the first sidewall and at least 70 degrees from the direction that is substantially perpendicular to the first surface toward the second sidewall,
wherein the metasurface is within the first and second sidewalls and receives the NIR radiation through a microlens on the metasurface, and
wherein the first and second sidewalls are reflecting to create spatially localized resonances of a target wavelength that lengthens a path of the NIR radiation.

13. The pixel of claim 12, wherein the predetermined range of wavelengths of light comprises 700 nm to 1100 nm inclusive.

14. The pixel of claim 12, wherein the pixel comprises a thickness in the first direction of less than or equal to 5 μm.

15. The pixel of claim 12, wherein a standing wave pattern forms in an active region of the pixel.

16. The pixel of claim 12, wherein the photodetector comprises a silicon-based photodetector, and
wherein the pixel absorbs at least 20% of a power of the predetermined range of wavelengths of light.

17. The pixel of claim 16, wherein the photodetector comprises an avalanche photodiode, a single photon avalanche diode, a quanta image sensor or a PIN diode.

18. The pixel of claim 12, wherein the first sidewall and the second sidewall comprise deep trench isolation (DTI) structures.

19. The pixel of claim 18, wherein the first sidewall and the second sidewall comprise a metal or a doped semiconductor material.

20. The pixel of claim 12 wherein the pixel is part of an array of pixels.

\* \* \* \* \*